(12) United States Patent
Park

(10) Patent No.: US 12,490,380 B2
(45) Date of Patent: Dec. 2, 2025

(54) DISPLAY APPARATUS

(71) Applicant: LG Display Co., Ltd., Seoul (KR)

(72) Inventor: Sehwan Park, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 231 days.

(21) Appl. No.: 17/970,302

(22) Filed: Oct. 20, 2022

(65) Prior Publication Data
US 2023/0189441 A1    Jun. 15, 2023

(30) Foreign Application Priority Data
Dec. 10, 2021 (KR) .......... 10-2021-0176309

(51) Int. Cl.
*H05K 1/14* (2006.01)
*H05K 5/03* (2006.01)

(52) U.S. Cl.
CPC .............. *H05K 1/147* (2013.01); *H05K 5/03* (2013.01); *H05K 2201/10128* (2013.01)

(58) Field of Classification Search
CPC ........ H05K 1/028; H05K 1/147; H05K 1/189; H05K 5/03; H05K 2201/056; H05K 2201/10128
See application file for complete search history.

(56) References Cited

U.S. PATENT DOCUMENTS

| | | | |
|---|---|---|---|
| 9,482,915 B2 | 11/2016 | Yoon et al. | |
| 10,910,589 B2 | 2/2021 | Jeong et al. | |
| 11,668,983 B2 | 6/2023 | Lim et al. | |
| 2009/0191746 A1* | 7/2009 | Ma | H01R 13/658 439/350 |
| 2015/0253613 A1* | 9/2015 | Yoon | G02F 1/13452 349/58 |
| 2016/0183387 A1* | 6/2016 | Tsunekawa | G02F 1/133308 361/749 |
| 2020/0170148 A1* | 5/2020 | Bang | H05K 7/20509 |

(Continued)

FOREIGN PATENT DOCUMENTS

| | | |
|---|---|---|
| KR | 10-2015-0105525 A | 9/2015 |
| KR | 10-2016-0082860 A | 7/2016 |

(Continued)

OTHER PUBLICATIONS

Korean Intellectual Property Office, Office Action, Korean Patent Application No. 10-2021-0176309, Jan. 17, 2025, 11 pages.

*Primary Examiner* — Imani N Hayman
(74) *Attorney, Agent, or Firm* — Fenwick & West LLP

(57) ABSTRACT

A display apparatus includes a display panel for reproducing an image or a video, a metal plate disposed in the rear of the display panel, a printed circuit board disposed in the rear of the metal plate and electrically connected to the display panel, and a chip-on-film having one end electrically connected to the display panel and the other end electrically connected to the printed circuit board, wherein a portion of the chip-on-film is bendable, and the metal plate includes a bending guide formed at a position corresponding to the bendable portion of the chip-on-film and guiding a bent shape of the chip-on-film. The bending guide disposed in a portion where the chip-on-film is bent may prevent a curvature of the chip-on-film from deviating from a designed range of the curvature, thereby suppressing excessive bending of the chip-on-film.

13 Claims, 14 Drawing Sheets

(56) References Cited

U.S. PATENT DOCUMENTS

| | | | | |
|---|---|---|---|---|
| 2020/0174526 A1* | 6/2020 | Jeong | .................. | G09F 9/301 |
| 2020/0185641 A1* | 6/2020 | Jeong | .................. | H10K 77/111 |
| 2020/0192433 A1* | 6/2020 | Shin | .................. | H10K 59/131 |
| 2021/0151541 A1* | 5/2021 | Lim | .................. | G02F 1/133512 |
| 2021/0296421 A1* | 9/2021 | Moon | .................. | G06F 3/044 |

FOREIGN PATENT DOCUMENTS

| | | |
|---|---|---|
| KR | 10-2020-0069527 A | 6/2020 |
| KR | 10-2021-0060733 A | 5/2021 |
| KR | 10-2275727 B1 | 7/2021 |

\* cited by examiner

DISPLAY APPARATUS

CROSS-REFERENCE TO RELATED APPLICATION

This application claims priority from Korean Patent Application No. 10-2021-0176309 filed on Dec. 10, 2021 in the Korean Intellectual Property Office, and all the benefits accruing therefrom under 35 U.S.C. 119, the contents of which in its entirety are herein incorporated by reference.

BACKGROUND

Field

The present disclosure relates to a display apparatus, and more particularly, to a display apparatus having a structure that effectively guides bending of a chip-on-film.

Description the of Related Art

Contents described in this Background section simply provide background information about the present disclosure and do not constitute the prior art.

As we enter a full-fledged information era, a display apparatus that visually expresses an electrical information signal has developed rapidly. In response thereto, various display apparatus having excellent performance, thinness, light weight, and low power consumption have been developed.

The display apparatus include a liquid crystal display apparatus (LCD), a quantum dot (QD) display apparatus, a field emission display apparatus (FED), an electro-wetting display apparatus (EWD), and an organic light-emitting display apparatus (OLED), etc.

The display apparatus is miniaturized so that the apparatus may be carried by a user. The display apparatus has been developed to be mounted on a movable apparatus such as a vehicle. Thus, the user may use the display apparatus on the vehicle more conveniently.

SUMMARY

A display apparatus may include a chip-on-film (COF). The chip-on-film may have a built-in driver for driving the display apparatus. The chip-on-film may be made of a thin flexible material. Therefore, the chip-on-film is very efficient in increasing convenience of assembly and reducing a space occupied by parts.

The chip-on-film may electrically connect a display panel and a printed circuit board to each other. To this end, the chip-on-film may be disposed to be bent in a portion adjacent to an edge of the display panel. Therefore, the chip-on-film may protrude from a lower end of the display panel.

A length at which the chip-on-film protrudes from the lower end of the display panel, that is, a protrusion length is a length from the lower end of the display panel to a lower end of a bendable portion of the chip-on-film.

The protrusion length of the chip-on-film is a length of a portion thereof exposed from the lower end of the display panel. Therefore, when a user looks at a front face of the display panel, the portion corresponding to the protrusion length comes into a field of view of the user, which may deteriorate aesthetics of the display apparatus.

Therefore, in order to increase the aesthetics of the display apparatus, the portion corresponding to the protrusion length of the chip-on-film becomes not visible using a black ink or the like on a cover glass, which becomes a bezel.

As an area of the bezel increases, the aesthetics of the display apparatus may also be degraded and an unnecessary area of the display apparatus may be increased. Therefore, it is necessary to reduce the protrusion length of the chip-on-film to reduce the area of the bezel.

In order to reduce the protrusion length of the chip-on-film, the chip-on-film may be excessively bent. When the chip-on-film is excessively bent, the chip-on-film may be damaged, which may cause malfunction or failure of the display apparatus.

In one example, when the display apparatus is mounted on a movable apparatus such as a vehicle, impact that may be applied from the outside by movement may be transmitted to the display apparatus.

Due to the external impact, the display apparatus may be deformed or, in severe cases, may be damaged by the external impact. When the damage is severe, fragments of the display apparatus may injure the user aboard the vehicle.

Even when the display apparatus is not damaged after being subjected to the external impact, some parts constituting the display apparatus may be damaged by the external impact, resulting in the malfunction or the failure of the display apparatus.

In particular, in a case of a display apparatus having a slim structure or a display apparatus having a flexible component that is bent, the influence of the external impact may become greater.

Because the chip-on-film is formed to be thin, the chip-on-film may be vulnerable to the external impact. The chip-on-film may be damaged due to such external impact. Therefore, a development of technology capable of suppressing the damage of the chip-on-film resulting from the external impact is required.

Accordingly, a purpose of the present disclosure is to provide a display apparatus having a structure capable of suppressing excessive bending of a chip-on-film.

In addition, an optional purpose of the present disclosure is to provide a display apparatus having a structure that may effectively respond to external impact.

In addition, an optional purpose of the present disclosure is to provide a display apparatus having a structure that may suppress a chip-on-film from being damaged by external impact.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

One embodiment of a display apparatus may include a display panel for reproducing an image or a video, a metal plate disposed in the rear of the display panel, a printed circuit board disposed in the rear of the metal plate and electrically connected to the display panel, and a chip-on-film (COF) having one end electrically connected to the display panel and the other end electrically connected to the printed circuit board, wherein a portion of the COF is bendable, and the metal plate includes a bending guide formed at a position corresponding to the bendable portion of the chip-on-film and guiding a bent shape of the chip-on-film.

One embodiment of the display apparatus may optionally further include a cover glass disposed at a frontmost portion of the display apparatus, an adhesive layer disposed in the rear of the cover glass, and a polarizing portion disposed between the adhesive layer and the display panel.

One embodiment of the display apparatus may optionally further include a guide holder disposed between the metal plate and the printed circuit board, and the printed circuit board is mounted on one face of the guide holder.

In the display apparatus according to the present disclosure, the bending guide disposed in the portion where the chip-on-film is bent prevents the curvature of the chip-on-film from deviating from the designed range of curvature, thereby suppressing the excessive bending of the chip-on-film. Accordingly, the chip-on-film may be effectively suppressed from being excessively bent and damaged.

In addition, in the display apparatus according to the present disclosure, for example, the bending guide may be formed in the portion corresponding to the driving chip, and may include an avoidance hole for avoiding contact between a driving chip and the bending guide.

When assembly of the chip-on-film onto the display apparatus is completed, the driving chip disposed on the chip-on-film may be placed in the avoidance hole of the bending guide. Because of such structure, the driving chip may be suppressed from being in contact with the bending guide and being damaged by an external force.

In addition, in the display apparatus according to the present disclosure, the bending guide may optionally include an elastic deformation reinforcing portion which may be elastically deformed to buffer the impact when being subjected to the external impact. Therefore, the bending guide placed in contact with or close to the chip-on-film may buffer the impact when being subjected to the external impact, thereby effectively suppressing the chip-on-film from colliding with the bending guide and being damaged by the external impact.

Further, when the external impact is applied to the bending guide, the chip-on-film may move together while the elastic deformation reinforcing portion is elastically deformed, so that the external impact applied to the chip-on-film may be alleviated.

In addition, a modified embodiment of a display apparatus may include: a display panel; a printed circuit board disposed on the rear side of the display panel; a chip-on-film having one end electrically connected to the display panel and the other end electrically connected to the printed circuit board; and a bending guide that is disposed at a position corresponding to a bendable portion of the chip-on-film between the display panel and the printed circuit board, and limits bending of the chip-on-film.

Effects of the present disclosure are not limited to the above-mentioned effects, and other effects as not mentioned will be clearly understood by those skilled in the art from following descriptions.

DETAILED DESCRIPTIONS

Figure 1:
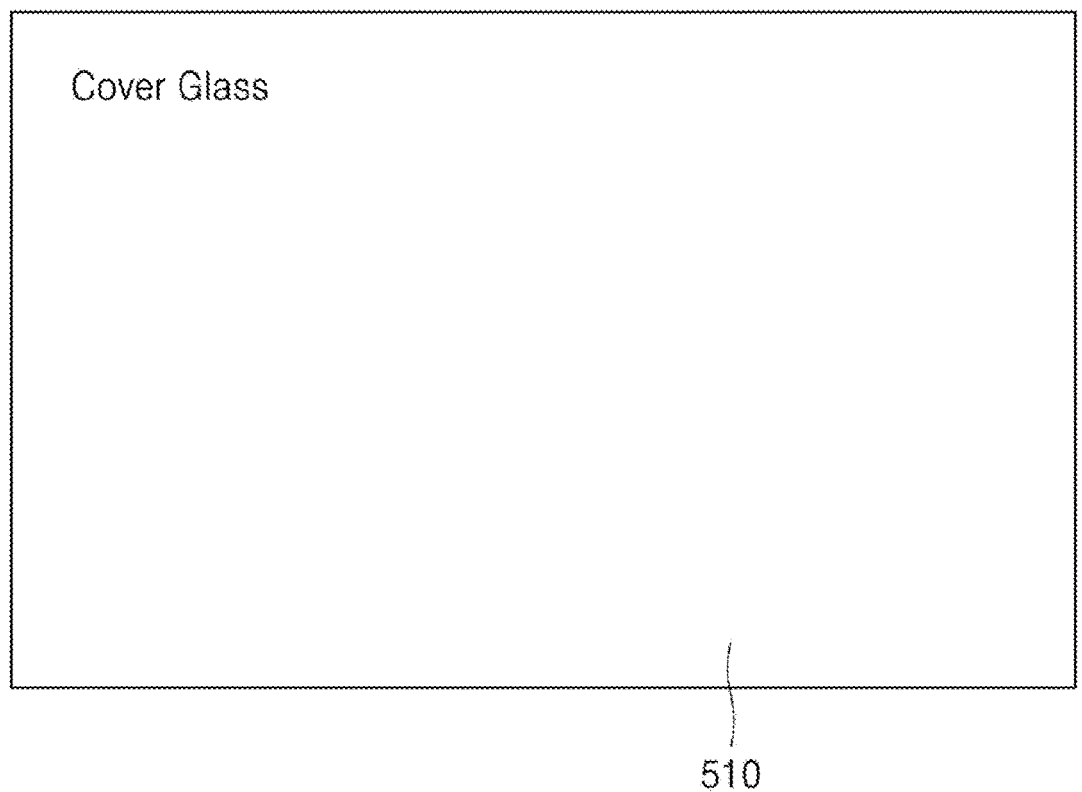
FIG. 1 is a front view of a display apparatus according to one embodiment.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
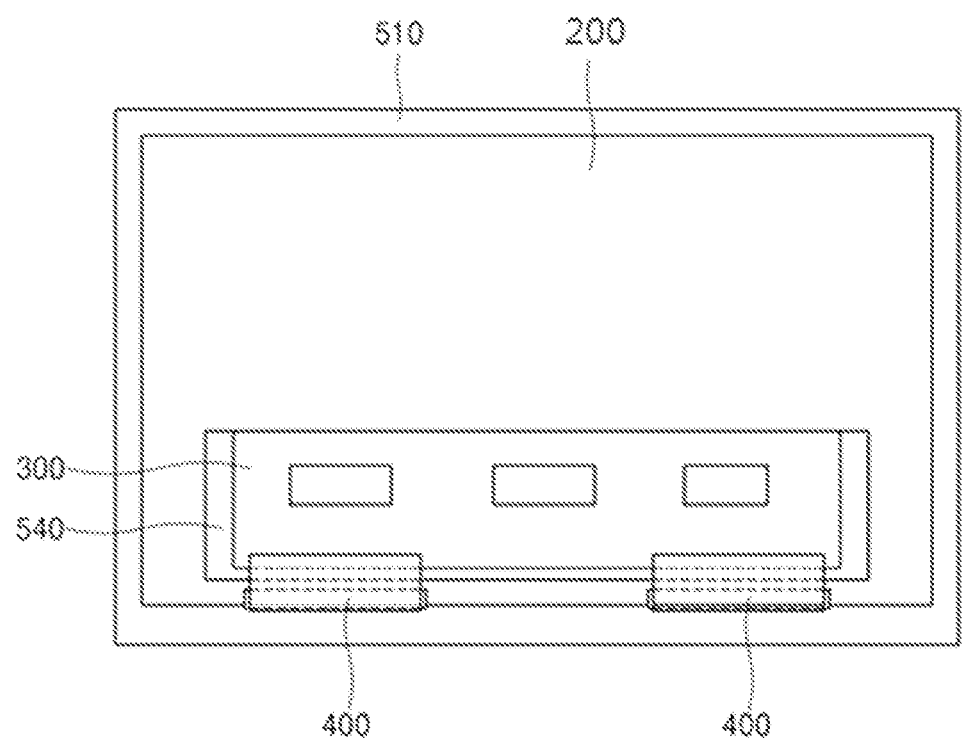
FIG. 2 is a rear view of a display apparatus according to one embodiment.
Figure 3:
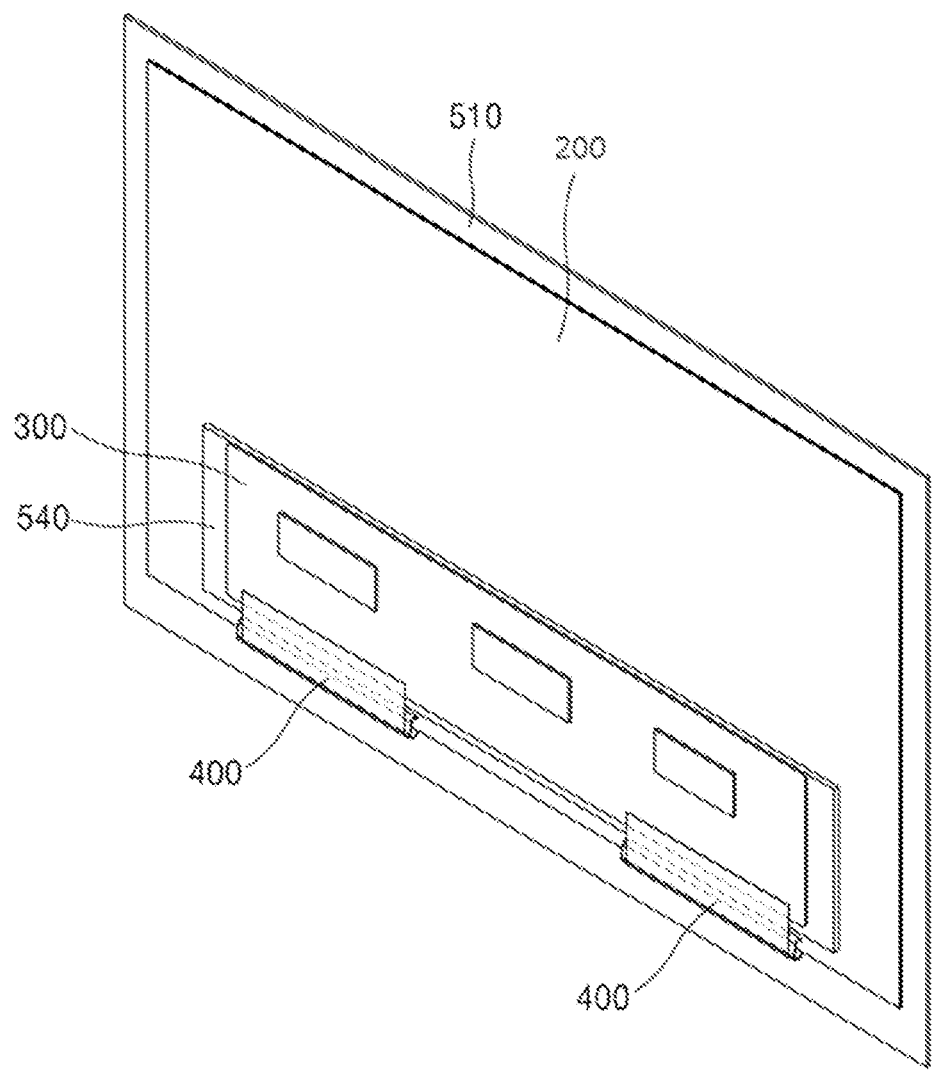
FIG. 3 is a rear perspective view of a display apparatus according to one embodiment.
Figure 4:
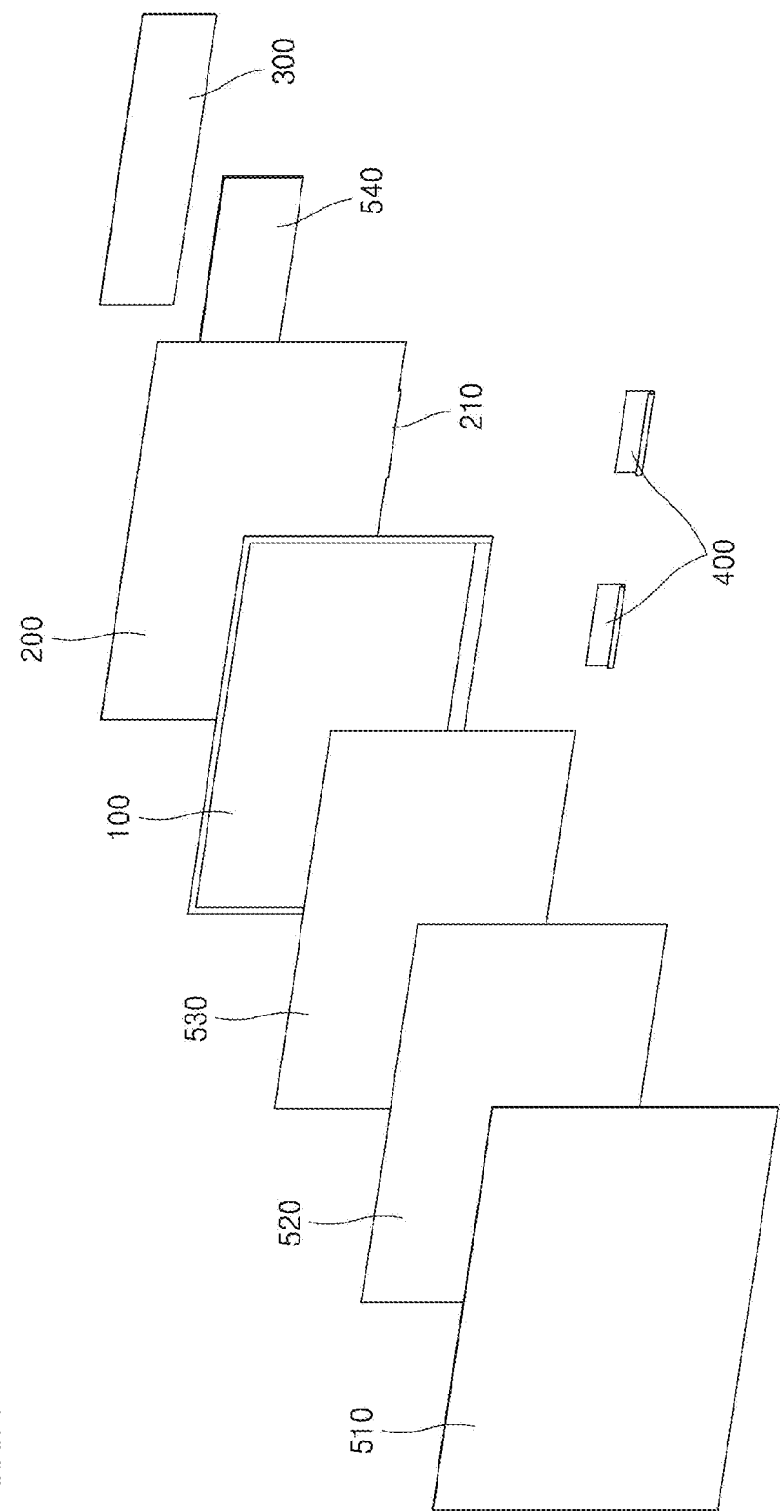
FIG. 4 is an exploded perspective view of a display apparatus according to one embodiment.

FIG. 1 is a front view of a display apparatus according to one embodiment. FIG. 2 is a rear view of a display apparatus according to one embodiment. FIG. 3 is a rear perspective view of a display apparatus according to one embodiment. FIG. 4 is an exploded perspective view of a display apparatus according to one embodiment.

A display apparatus according to an embodiment may be mounted on a cockpit of a vehicle, for example, to provide an image or a video necessary for driving to a driver and a passenger of the vehicle. However, the present disclosure may not be limited thereto, and the display apparatus may be used while being carried by a user without being mounted in the vehicle. Hereinafter, for example, the display apparatus mounted in the vehicle will be described.

A display apparatus according to an embodiment may include a display panel 100, a metal plate 200, a printed circuit board 300, and a chip-on-film 400.

The image or the video may be reproduced on the display panel 100. The reproduced image or video may be navigation information necessary for the driving, an image filmed by a camera mounted on the vehicle, or other various contents necessary for the driver or the passenger.

The metal plate 200 may be disposed in the rear of the display panel 100. The metal plate 200 may be formed to be thin to manufacture a slim display panel. The metal plate 200 may serve as a heat-dissipation plate that cools the display panel 100 by dissipating heat generated from the display panel 100 to the outside.

The metal plate 200 may be made of a material, for example, an aluminum material, that is easy to be manufactured by sheet metal processing, has a high heat transfer rate, and has excellent resistance. However, the present disclosure is not limited thereto.

In one example, a back plate may be disposed between the display panel 100 and the metal plate 200. The back plate may be attached to a back face of the display panel 100 to prevent the display panel 100 from being bent and damaged. That is, the back plate may serve to reinforce rigidity of the display panel 100.

The back plate may be formed in a shape of a film, for example, and attached to the display panel 100. However, the present disclosure is not limited thereto.

The printed circuit board 300 may be disposed in the rear of the metal plate 200 and may be electrically connected to the display panel 100. The printed circuit board 300 may be mounted on a guide holder 540 and may be electrically connected to the display panel 100.

The printed circuit board 300 may include a camera, an apparatus for communication with an external apparatus such as a main control module of the vehicle, and an apparatus for driving the display panel 100 such that the display panel 100 reproduces the image or the video, may include a circuit, and may include various other active and passive elements.

The chip-on-film (COF) 400 may be constructed such that one end thereof is electrically connected to the display panel 100, the other end thereof is electrically connected to the printed circuit board 300, and a portion thereof is bendable.

One end of the chip-on-film 400 may be electrically connected to the display panel 100 and the other end thereof may be electrically connected to the printed circuit board 300. The chip-on-film 400 may be bent to surround the guide holder 540.

The chip-on-film 400 may be formed to be thin and may be made of a flexible material so as to be bendable. The chip-on-film 400 may electrically connect the display panel 100 and the printed circuit board 300 to each other. The chip-on-film 400 may include various active and passive elements, and may have a driving circuit for driving the display panel 100.

The driving circuit for driving the display panel 100 may extend on both the printed circuit board 300 and the chip-on-film 400. The chip-on-film 400 may include a driving chip 410 (see FIG. 7) for driving the display panel 100. That is, the driving chip 410 (see FIG. 7) that forms at least a portion of the driving circuit of the display panel 100 may be disposed on the chip-on-film 400.

A plurality of chip-on-films 400 may be disposed. The chip-on-films 400 may be disposed to be spaced apart from each other.

The display apparatus according to an embodiment may include a cover glass 510, an adhesive layer 520, a polarizing portion 530, and the guide holder 540. The adhesive layer 520 and the polarizing portion 530 may be formed to be thin to manufacture the slim display panel.

The cover glass 510 may be disposed at a frontmost portion of the display apparatus. The cover glass 510 may be disposed in front of the display panel 100 to protect the display panel 100. The cover glass 510 may be made of a transparent material, so that light irradiated from the cover glass 510 may pass through the cover glass 510.

The adhesive layer 520 may be disposed in the rear of the cover glass 510. One face of the adhesive layer 520 may be adhered to the cover glass 510 and the other face thereof may be adhered to the polarizing portion 530 to adhere the polarizing portion 530 to the cover glass 510.

The polarizing portion 530 may be disposed between the adhesive layer 520 and the display panel 100. The polarizing portion 530 may be formed in a shape of a thin film and may be attached to the display panel 100. Accordingly, the display panel 100 may be attached to the cover glass 510 by the adhesive layer 520 and the polarizing portion 530.

The polarizing portion 530 may be disposed on a front face of the display panel 100 to polarize light irradiated from the display panel 100 to provide the user with a clear image or video.

The guide holder 540 may be disposed between the metal plate 200 and the printed circuit board 300, and the printed circuit board 300 may be mounted on one face of the guide holder 540. The printed circuit board 300 may be mounted on the guide holder 540 and may be electrically connected to the display panel 100. The guide holder 540 may be mounted on the metal plate 200, and the printed circuit board 300 may be mounted on a back face of the guide holder 540.

The printed circuit board 300 may be mounted on the back face of the guide holder 540. The display panel 100 may be disposed in front of the guide holder 540. Therefore, in order for the chip-on-film 400 to be electrically connected to the printed circuit board 300 and the display panel 100, both ends of the chip-on-film 400 should be coupled to the printed circuit board 300 and the display panel 100, respectively.

Therefore, the chip-on-film 400 must extend over the metal plate 200 located between the guide holder 540 and the display panel 100, and may also extend over the guide holder 540.

Because of such structure, when the display apparatus is assembled, the chip-on-film 400 may be disposed to extend over the metal plate 200 and the guide holder 540 at a location beneath a lower end of the guide holder 540.

When looking at lower ends of the metal plate 200 and the guide holder 540, the lower end of the metal plate 200 may be placed at the lowest location. This is because a length in a downward direction of the metal plate 200 is greater than that of the guide holder 540.

Therefore, the chip-on-film 400 may be bendable at a portion thereof corresponding to the lower end of the metal plate 200, which is a portion extending over the metal plate 200 and the guide holder 540. In addition, because of such structure, the chip-on-film 400 may be disposed to protrude from the lower end of the metal plate 200.

In one example, the lower end of the metal plate 200 and a lower end of the display panel 100 may be placed at the substantially same location or similar locations. Therefore, a length at which the chip-on-film 400 protrudes from the lower end of the metal plate 200 may be similar to a protrusion length from the lower end of the display panel 100.

The length at which the chip-on-film 400 protrudes from the lower end of the display panel 100, that is, the protrusion length, is a length from the lower end of the display panel 100 to a lower end of the bendable portion of the chip-on-film 400.

The protrusion length of the chip-on-film 400 is a length of the portion exposed from the lower end of the display panel 100. Therefore, when the user looks at a front face of the display panel 100, the portion corresponding to the protrusion length comes into a field of view of the user, which may degrade aesthetics of the display apparatus.

Therefore, in order to increase the aesthetics of the display apparatus, the portion corresponding to the protrusion length of the chip-on-film 400 becomes not visible using a black ink or the like on the cover glass 510, which becomes a bezel.

As an area of the bezel increases, the aesthetics of the display apparatus may also be degraded and an unnecessary area of the display apparatus may be increased. Therefore, it is necessary to reduce the protrusion length of the chip-on-film 400 to reduce the area of the bezel.

In order to reduce the protrusion length of the chip-on-film 400, the chip-on-film 400 may be disposed to be bent so as to extend over the guide holder 540 at a location extremely adjacent to the lower end of the guide holder 540. For this reason, the bendable portion of the chip-on-film 400 may be disposed at a location extremely adjacent to the lower end of the display panel 100 in a vertical direction.

When the chip-on-film 400 is excessively bent to reduce the protrusion length of the chip-on-film 400, the chip-on-film 400 formed to be thin may be damaged, which may cause malfunction or failure of the display apparatus.

Further, in the assembly process, the chip-on-film 400 may be bent excessively even though it is not intended, and thus may be damaged.

Therefore, it is necessary to suppress the damage of the chip-on-film 400 resulting from the excessive bending by allowing the chip-on-film 400 to be bent with a designed curvature. To this end, in an embodiment, the metal plate 200 may have a bending guide 210. Hereinafter, the bending guide 210 will be described in detail with reference to the drawings.

Note that, in a display apparatus (not shown) according to a modified embodiment, the metal plate 200 may be omitted. For (but not limited to) a case where the metal plate 200 is omitted, the printed circuit board 300 may be disposed on the rear side of the display panel 100, and the bending guide 210 (which may separately formed, for example) may be disposed at a position corresponding to a bendable portion of the chip-on-film 400 between the display panel 100 and the printed circuit board 300, and may limit bending of the chip-on-film 400. As an example, such a bending guide may protrude from one end of the rear of the display panel, and at least a portion of the bending guide may be in a bent shape. The following description of the display apparatus and its components of the various embodiments can be similarly applied to this modified embodiment.

Figure 5:
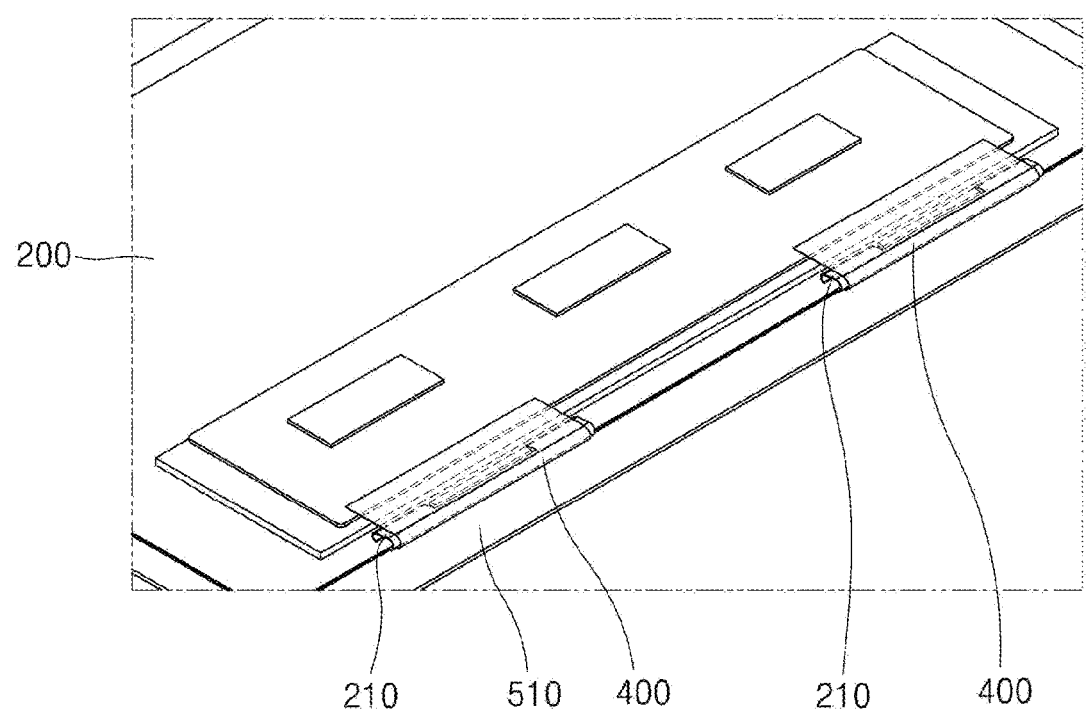
FIG. 5 is a partial perspective view of a display apparatus according to one embodiment.
Figure 6:
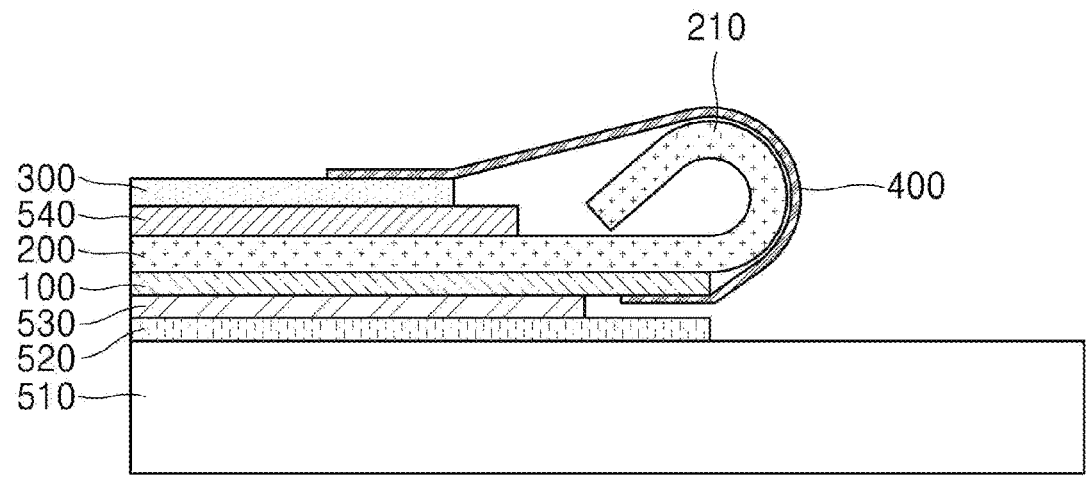
FIG. 6 is a partial cross-sectional view of a display apparatus according to one embodiment.
Figure 7:
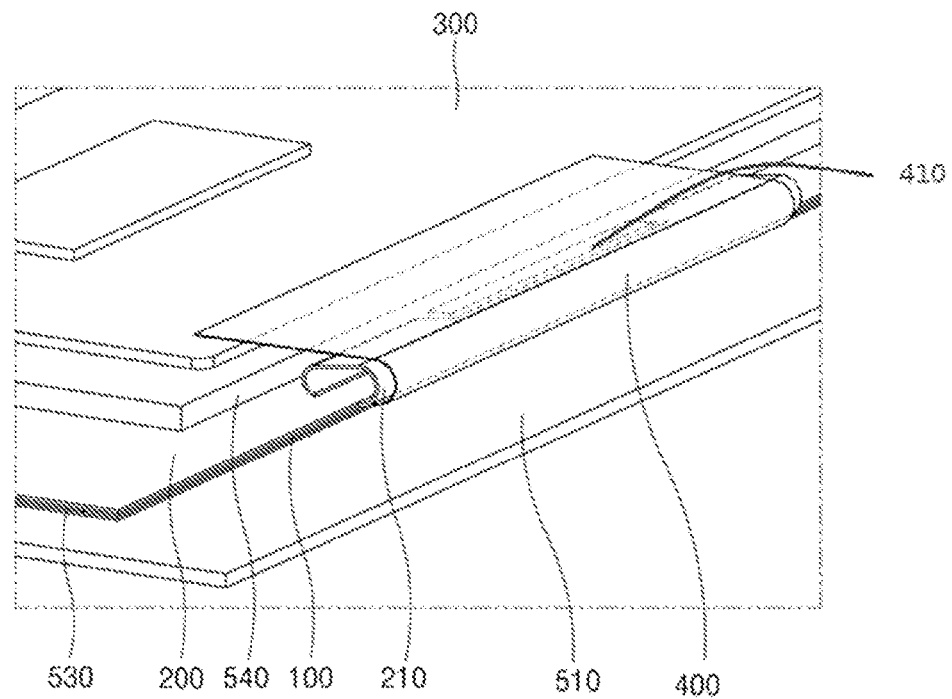
FIG. 7 is an enlarged view of a portion in FIG. 5.

FIG. 5 is a partial perspective view of a display apparatus according to one embodiment. FIG. 6 is a partial cross-sectional view of a display apparatus according to one embodiment. FIG. 7 is an enlarged view of a portion in FIG. 5.

The metal plate 200 may include the bending guide 210 that is formed at a location corresponding to the bendable portion of the chip-on-film 400 and guides a shape in which the chip-on-film 400 is bent.

The chip-on-film 400 may be disposed to be spaced apart from an end of the metal plate 200 to transverse the metal plate 200. The bending guide 210 may protrude from the end of the metal plate 200, and may be formed in a shape in which at least a portion thereof is bent.

As shown in FIG. 6, the bending guide 210 may protrude from the lower end of the metal plate 200 and may be bent rearwardly of the display apparatus. The chip-on-film 400 may be bent so as to surround an outer portion of the bending guide 210.

In the present embodiment, the bending guide 210 may be, for example, formed integrally with the metal plate 200, but the present disclosure is not limited thereto, that is, the bending guide 210 may be separately formed. For example, the bending guide 210 may be formed by forming a portion protruding from the end of the metal plate 200 and bending such protruding portion. The bending guide 210 may be formed to be thin like the metal plate 200 and may be formed in a bent shape.

The bending guide 210 may be formed by being bent with a designed curvature thereof. The bendable portion of the chip-on-film 400 may be guided by the bending guide 210 to be bent to have the designed curvature.

While the chip-on-film 400 is bent, the bent curvature thereof may be limited by the bending guide 210. Accordingly, a radius of curvature of the chip-on-film 400 may not become smaller than the range determined by the bending guide 210.

When the chip-on-film 400 is bent in the assembly process of the display apparatus, the chip-on-film 400 may no longer be excessively bent when one face thereof comes into contact with the bending guide 210.

In an embodiment, the bending guide 210 disposed at the portion where the chip-on-film 400 is bendable may suppress the excessive bending of the chip-on-film 400 by not allowing the curvature of the chip-on-film 400 to deviate from the designed range. Accordingly, it is possible to effectively suppress the excessive bending and the damage of the chip-on-film 400.

The chip-on-film 400 may include a plurality of chip-on-films, and the chip-on-films 400 may be disposed to be spaced apart from each other in a lateral direction of the display apparatus. The bending guide 210 may include a plurality of bending guides.

The bending guides 210 may be disposed at the end of the metal plate 200, and the number of bending guides 210 may correspond to the number of the chip-on-films 400. The bending guides 210 may be disposed to be spaced apart from each other in the lateral direction of the display apparatus. The bending guides 210 may be disposed at locations corresponding to the chip-on-films 400 in the lateral direction of the display apparatus.

At least a portion of the chip-on-film 400 may be disposed to be in contact with the bending guide 210. Alternatively, at least a portion of the chip-on-film 400 may maintain a state of being spaced apart from the bending guide 210.

For example, the chip-on-film 400 may be spaced apart from the bending guide 210 without being in contact with the bending guide 210. In this case, because the bendable portion of the chip-on-film 400 maintains a curvature greater than a designed minimum curvature, the chip-on-film 400 is not likely to be damaged by the excessive bending.

For example, the chip-on-film 400 may be disposed such that most of one face thereof is in contact with one face of the bending guide 210. Even in such case, because the bendable portion of the chip-on-film 400 maintains the curvature equal to or greater than the designed minimum curvature, the chip-on-film 400 is not likely to be damaged by the excessive bending.

Hereinafter, various embodiments of the bending guide 210 will be described in detail with reference to the drawings.

Figure 8A:
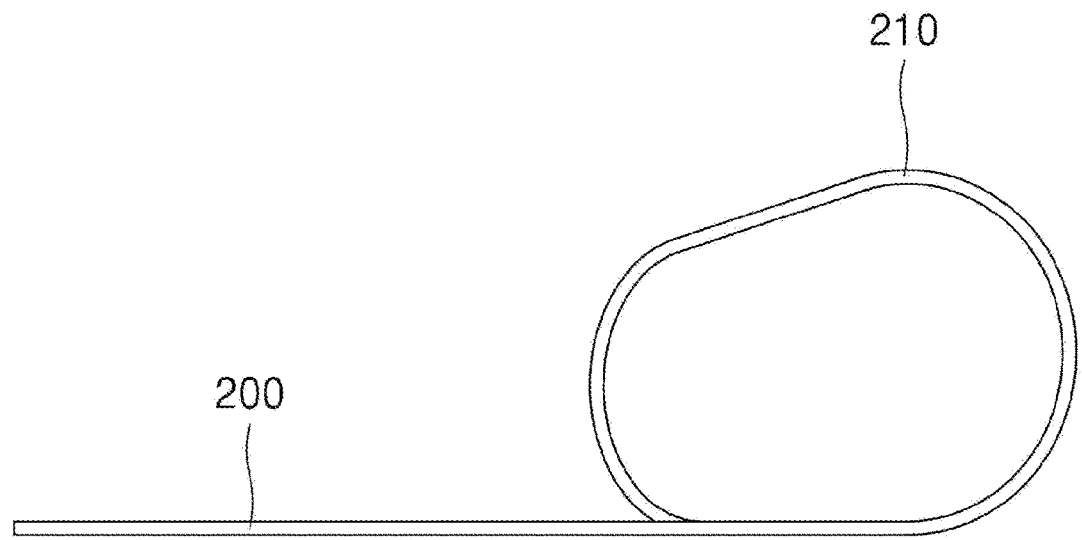
FIG. 8A is a cross-sectional view showing a bending guide according to one embodiment.

FIG. 8A is a cross-sectional view showing the bending guide 210 according to one embodiment. As shown in FIG. 8A, the bending guide 210 according to an embodiment may have a curved cross-section, i.e., having a cross-section of a shape including a curved section. As a whole, the bending guide 210 may be formed in a shape of a closed curve having an irregular curvature.

Figure 8B:
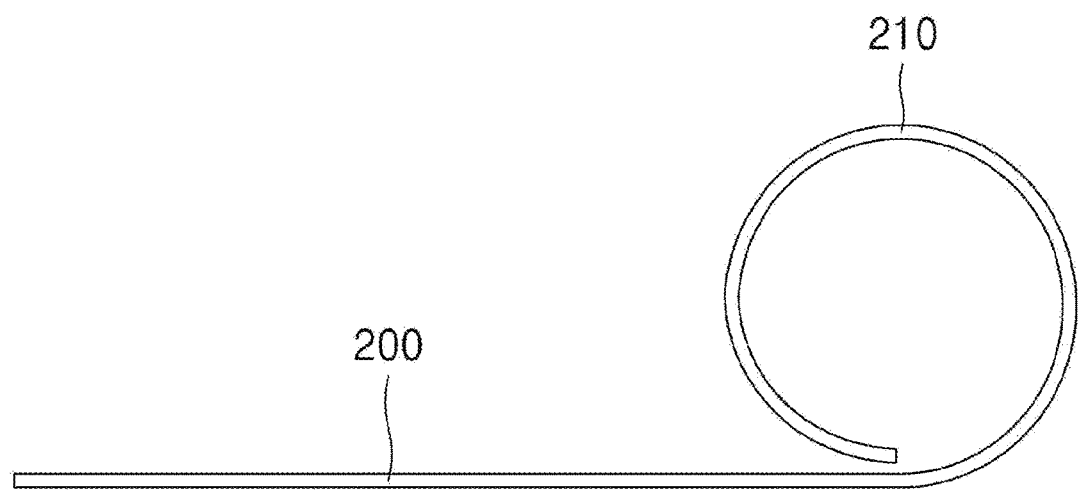
FIG. 8B is a cross-sectional view showing a bending guide according to another embodiment.

FIG. 8B is a cross-sectional view showing the bending guide 210 according to another embodiment. As shown in FIG. 8B, the bending guide 210 may have a circular cross-section.

Because the chip-on-film 400 is bent by being guided by the circular shape of the bending guide 210, the chip-on-film 400 may be bent to have a substantially constant curvature in a portion thereof corresponding to the bending guide 210.

Figure 8C:
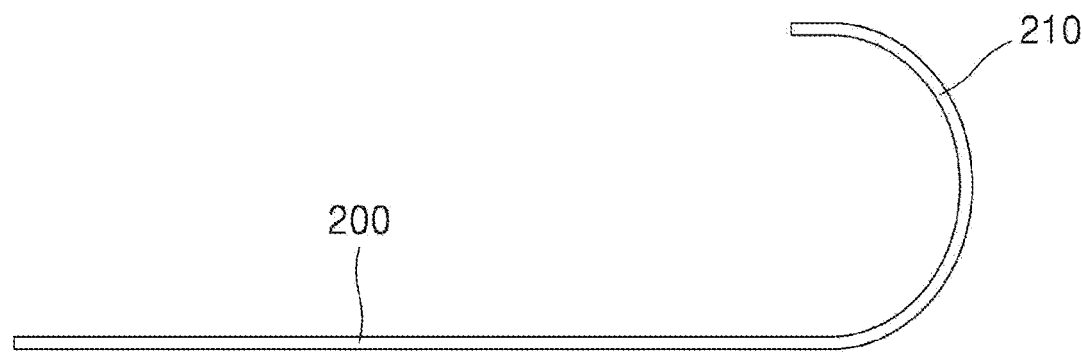
FIG. 8C is a cross-sectional view showing a bending guide according to another embodiment.

FIG. 8C is a cross-sectional view showing the bending guide 210 according to another embodiment. As shown in FIG. 8C, the bending guide 210 may have an arc-shaped cross-section. In this case, the arc may be formed in a shape outwardly convex from the lower end of the metal plate 200.

Because the chip-on-film 400 is bent by being guided by the arc shape of the bending guide 210, the chip-on-film 400 may be bent to have the substantially constant curvature in the portion thereof corresponding to the bending guide 210.

Figure 8D:
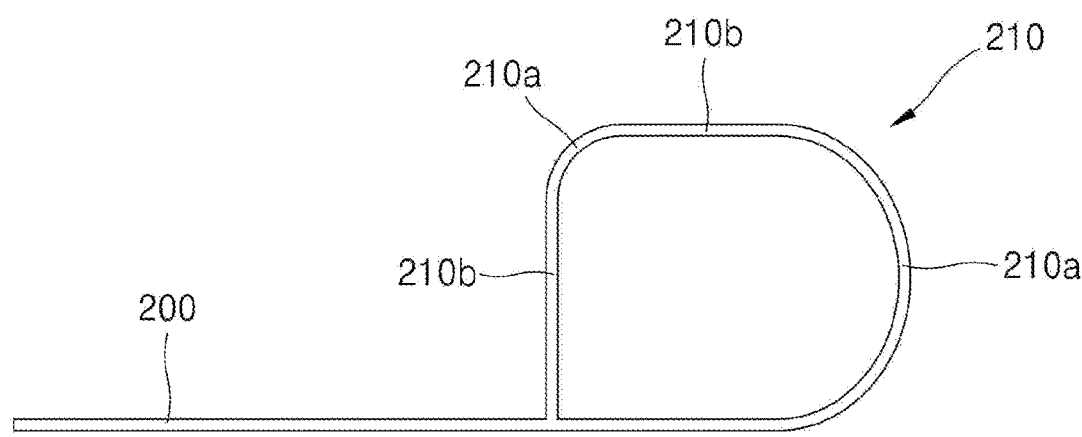
FIG. 8D is a cross-sectional view showing a bending guide according to another embodiment.

FIG. 8D is a cross-sectional view showing the bending guide 210 according to another embodiment. As shown in FIG. 8D, the bending guide 210 may have a cross-section having a shape including a curved section 210a and a straight section 210b.

In the bending guide 210, the curved section 210a having a shape outwardly convex from the lower end of the metal plate 200 may be formed. Because the chip-on-film 400 is bent by being guided by the bending guide 210 in the curved section 210a, the chip-on-film 400 may have the bendable portion having a substantially curved shape.

The bending guide 210 may be formed to include: a first straight section 210b connected to the curved section 210a which is outwardly convex from the lower end of the metal plate 200, and a second straight section 210b bent from the first straight section 210b. In this regard, in the straight section 210b in which a length direction thereof is in the vertical direction of the metal plate 200, at least a portion of the bending guide 210 may be in contact with the chip-on-film 400.

In another example, in order to avoid forming a sharp edge in a bent portion where the first straight section 210b and the second straight section 210b are connected to each other, a curved section 210a may be formed.

Figure 8E:
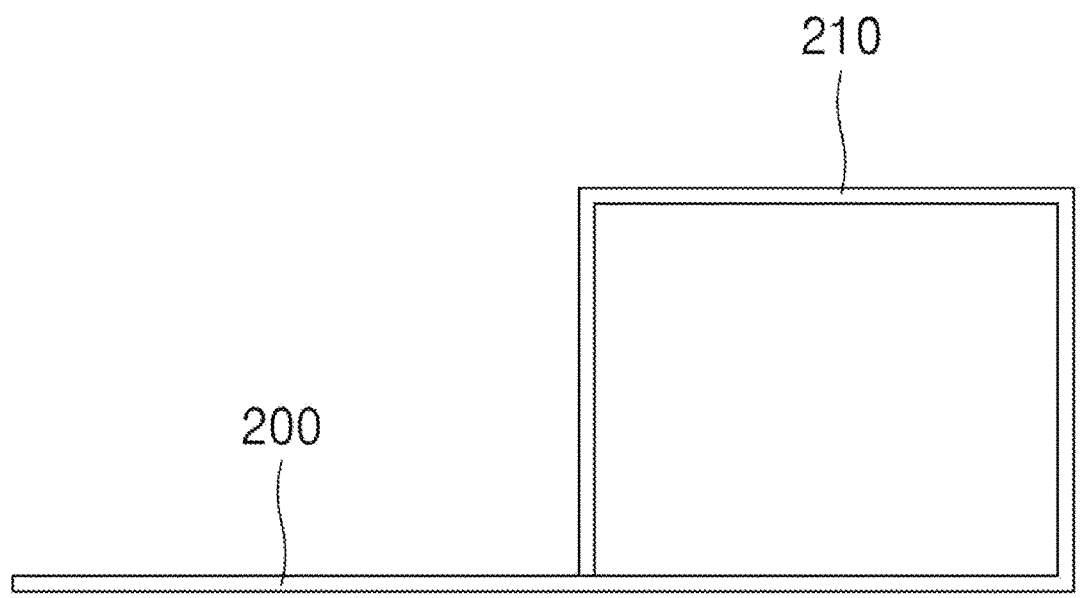
FIG. 8E is a cross-sectional view showing a bending guide according to another embodiment.

FIG. 8E is a cross-sectional view showing the bending guide 210 according to another embodiment. As shown in FIG. 8E, the bending guide 210 may have a polygonal cross-section.

However, in the case of the bending guide 210 having the polygonal cross-section, in order to prevent the chip-on-film 400 from being damaged by an edge of the bending guide 210, it is necessary to dispose the chip-on-film 400 at a location slightly spaced apart from the bending guide 210.

Figure 9:
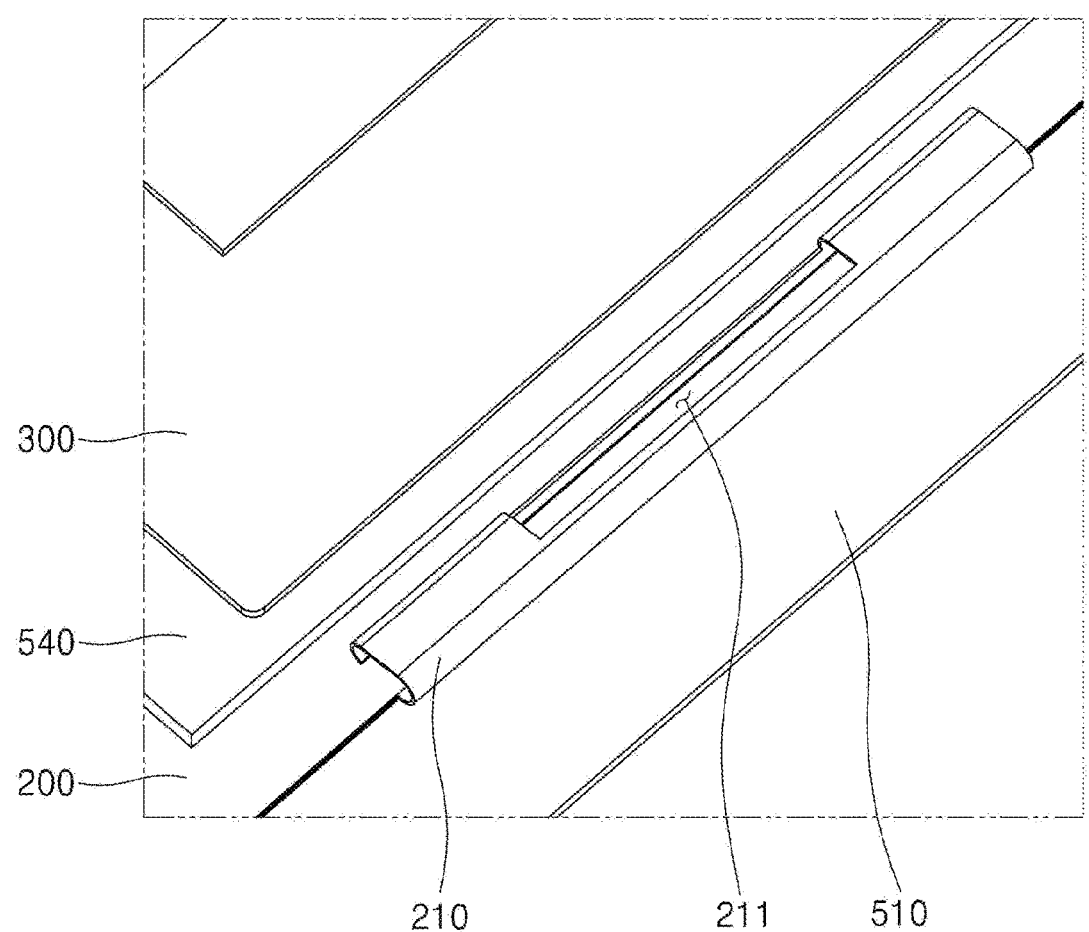
FIG. 9 is a perspective view for showing a bending guide according to another embodiment.
Figure 10:
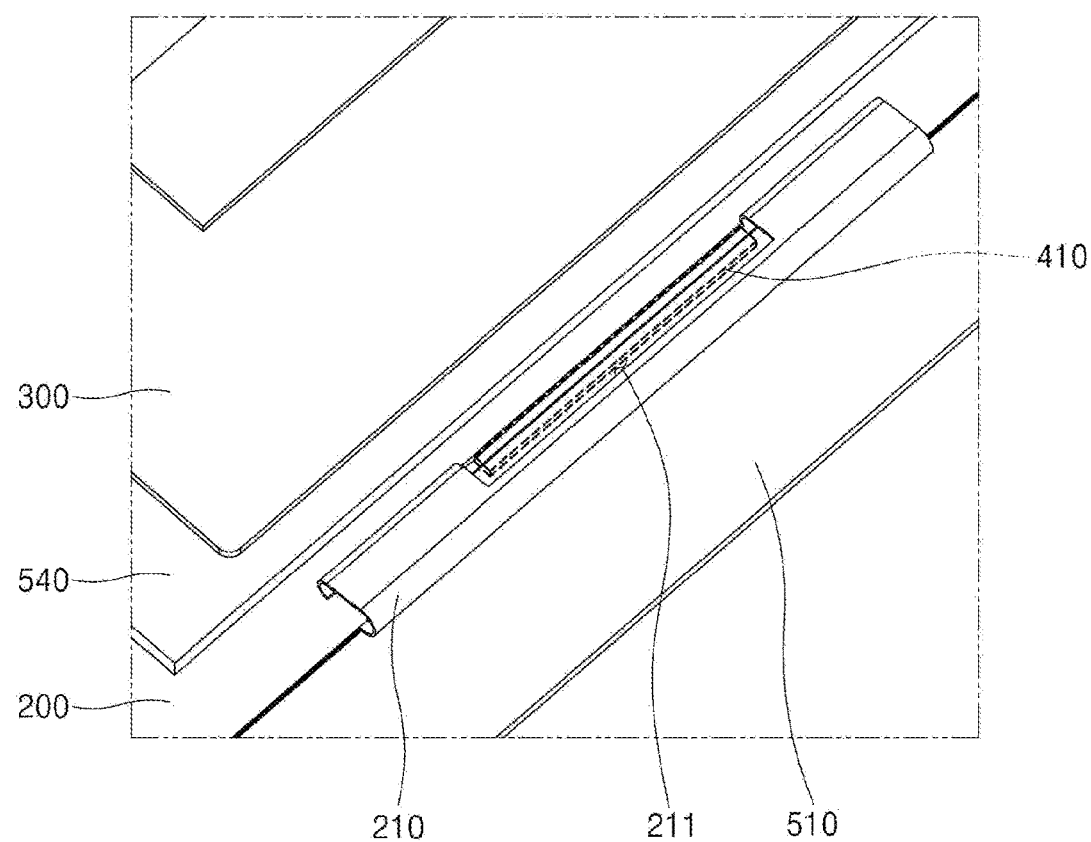
FIG. 10 is a view showing an arrangement relationship between a bending guide and a driving chip shown in FIG. 9.
Figure 11:
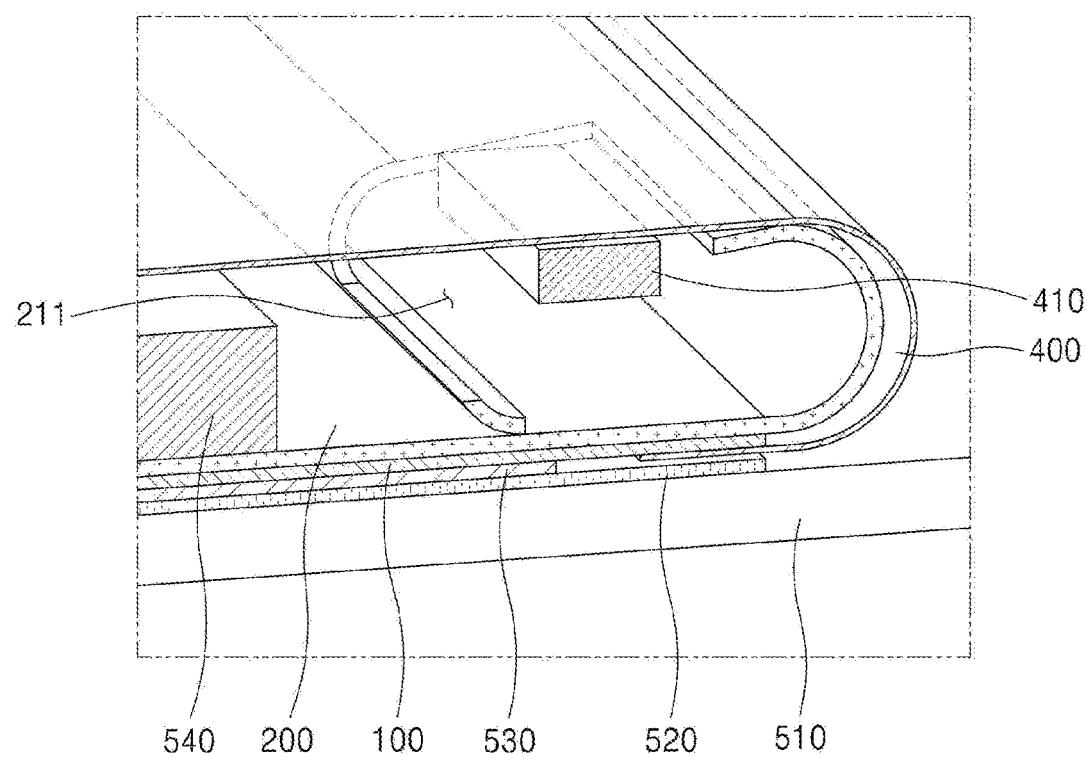
FIG. 11 is a cross-sectional view showing a portion of a bending guide shown in FIG. 9.

FIG. 9 is a perspective view for showing the bending guide 210 according to another embodiment. FIG. 10 is a view showing an arrangement relationship between the bending guide 210 and the driving chip 410 shown in FIG. 9. FIG. 11 is a cross-sectional view showing a portion of the bending guide 210 shown in FIG. 9.

The chip-on-film 400 may include the driving chip 410 for driving the display panel 100. Because such driving chip 410 has a constant volume, when the chip-on-film 400 is bent, the chip-on-film 400 may come into contact with the bending guide 210 at a portion thereof where the driving chip 410 is disposed. Therefore, there is a need for a structure to suppress the damage to the driving chip 410 of the chip-on-film 400 by the contact with the bending guide 210.

Accordingly, the bending guide 210 may be formed in the portion corresponding to the driving chip 410 and may have an avoidance hole 211 defined therein for avoiding the contact between the driving chip 410 and the bending guide 210. The avoidance hole 211 may be defined in a shape corresponding to a shape of the driving chip 410.

When assembly of the chip-on-film 400 to the display apparatus is completed, the driving chip 410 disposed on the chip-on-film 400 is placed in the avoidance hole 211 of the bending guide 210. Because of such structure, the driving chip 410 may be suppressed from being in contact with the bending guide 210 and being damaged by an external force.

Figure 12:
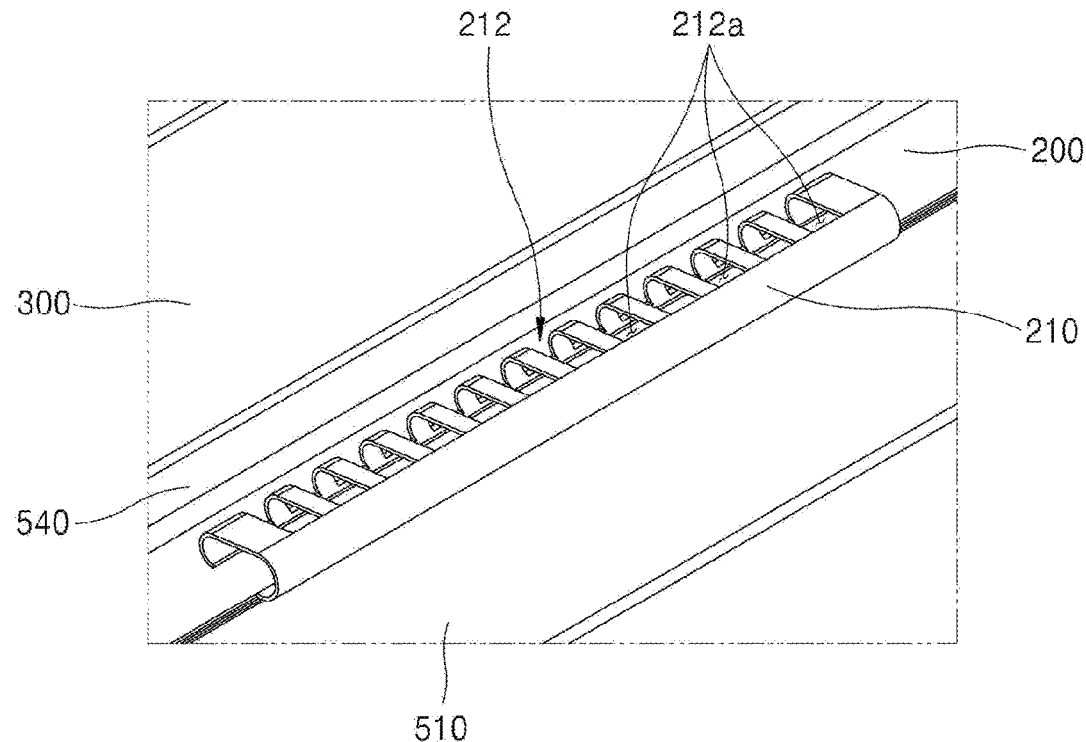
FIG. 12 is a perspective view for showing a bending guide according to another embodiment.
Figure 13:
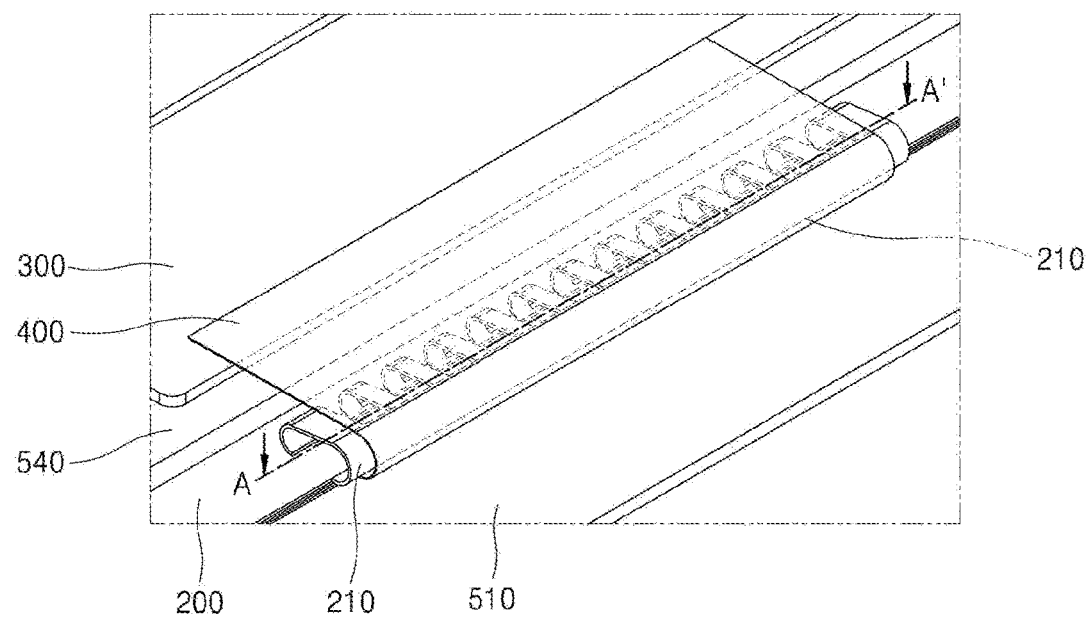
FIG. 13 is a view showing an arrangement relationship between a bending guide and a chip-on-film shown in FIG. 12.
Figure 14:
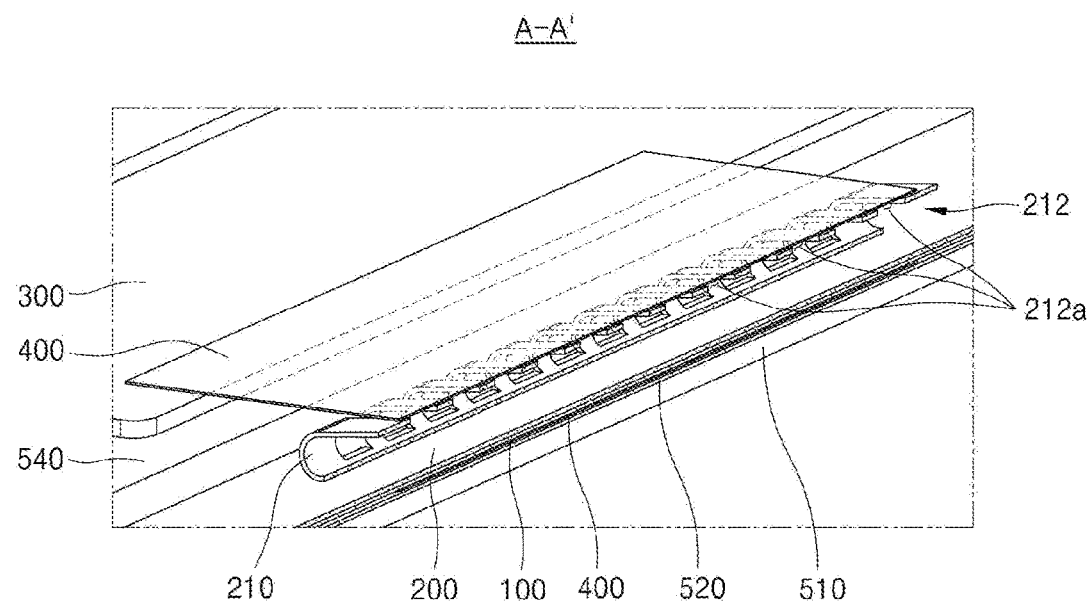
FIG. 14 is a cross-sectional view of a portion AA' in FIG. 13.

FIG. 12 is a perspective view for showing the bending guide 210 according to another embodiment. FIG. 13 is a view showing an arrangement relationship between the bending guide 210 and the chip-on-film 400 shown in FIG. 12. FIG. 14 is a cross-sectional view of a portion AA' in FIG. 13.

When the display apparatus is subjected to external impact, the chip-on-film 400 may move due to the impact. In this regard, the chip-on-film 400 comes into contact with the bending guide 210. When the bending guide 210 does not buffer the external impact, the chip-on-film 400 may be damaged when colliding with the bending guide 210.

Therefore, the bending guide 210 having a structure to buffer the external impact is required. Therefore, the bending guide 210 according to an embodiment may include an elastic deformation reinforcing portion 212 for increasing elastic deformation of the bending guide 210 in response to the external impact by reducing an area of the bending guide 210 in a length direction of the bending guide 210 (which length direction corresponds to, for example but not limited to, a lateral direction of the display panel).

When the external impact is applied to the bending guide 210, the elastic deformation reinforcing portion 212 may be elastically deformed to buffer the external impact applied to the bending guide 210. Accordingly, even when the chip-on-film 400 placed at the location corresponding to the bending guide 210 collides with the bending guide 210 by the external impact, impact applied to the chip-on-film 400 from the bending guide 210 may be alleviated.

In one example, when the chip-on-film 400 is placed to be in contact with the bending guide 210, when the external impact is applied to the bending guide 210, while the elastic deformation reinforcing portion 212 is elastically deformed, the chip-on-film 400 moves together, so that the external impact applied to the chip-on-film 400 may be alleviated.

The elastic deformation reinforcing portion 212 may be formed by defining a plurality of slit holes 212a to be spaced apart from each other in the length direction of the bending guide 210. The plurality of slit holes 212a may reduce a volume of the portion of the bending guide 210.

As the number of slit holes 212a increases, the buffering effect increases, but rigidity and durability of the bending guide 210 may be reduced. Therefore, in consideration of this, it is necessary to design the elastic deformation reinforcing portion 212 to have an appropriate number of slit holes 212a.

Therefore, when the external impact is applied, the elastic deformation reinforcing portion 212, which has a smaller volume than other portions of the bending guide 210, may be elastically deformed more easily than other portions, and may buffer the impact applied to the bending guide 210 through the elastic deformation.

In an embodiment, the elastic deformation reinforcing portion 212 may be elastically deformed when being subjected to the external impact to buffer the impact. Therefore, the bending guide 210 placed in contact with or close to the chip-on-film 400 buffers the external impact when being subjected to such impact, so that the chip-on-film 400 may be effectively suppressed from colliding with the bending guide 210 and being damaged by the external impact.

Further, when the external impact is applied to the bending guide 210, the chip-on-film 400 moves together while the elastic deformation reinforcing portion 212 is elastically deformed, so that the external impact applied to the chip-on-film 400 may be alleviated.

The display apparatus according to an embodiment of the present disclosure may be described as follows.

An aspect of the present disclosure provides a display apparatus including a display panel for reproducing an image or a video, a metal plate disposed in the rear of the display panel, a printed circuit board disposed in the rear of the metal plate and electrically connected to the display panel, and a chip-on-film (COF) having one end electrically connected to the display panel and the other end electrically connected to the printed circuit board, wherein a portion of the COF is bendable, wherein the metal plate includes a bending guide formed at a position corresponding to the bendable portion of the chip-on-film and guiding a bent shape of the chip-on-film.

In one implementation, the chip-on-film is disposed to be spaced apart from an end of the metal plate and cross the metal plate, and the bending guide protrudes from the end of the metal plate and is formed such that at least a portion thereof is in a bent shape.

In one implementation, a plurality of chip-on-films are disposed, a plurality of bending guides are disposed at an end of the metal plate, and the number of bending guides corresponds to the number of chip-on-films.

In one implementation, the chip-on-film is disposed such that at least a portion thereof is in contact with the bending guide.

In one implementation, at least a portion of the chip-on-film maintains a state of being spaced apart from the bending guide.

In one implementation, the bending guide has a cross-section of a shape including a curved section.

In one implementation, the bending guide has a circular or arc-shaped cross-section.

In one implementation, the bending guide has a polygonal cross-section.

In one implementation, the bending guide has a cross-section of a shape including a curved section and a straight section.

In one implementation, the chip-on-film includes a driving chip for driving the display panel, the bending guide includes an avoidance hole defined in a portion thereof corresponding to the driving chip, and the avoidance hole is for avoiding contact between the driving chip and the bending guide.

In one implementation, the bending guide includes an elastic deformation reinforcing portion for increasing elastic deformation of the bending guide against external impact by reducing an area of the bending guide in a length direction of the bending guide.

In one implementation, the elastic deformation reinforcing portion is formed by defining a plurality of slit holes to be spaced apart from each other in the length direction of the bending guide.

In one implementation, the display apparatus further includes a cover glass disposed at a frontmost portion of the display apparatus, an adhesive layer disposed in the rear of the cover glass, and a polarizing portion disposed between the adhesive layer and the display panel.

In one implementation, the display apparatus further includes a guide holder disposed between the metal plate and the printed circuit board, wherein the printed circuit board is mounted on one face of the guide holder.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display apparatus comprising:
a display panel including a front surface and a rear surface that is opposite the front surface, the display panel configured to reproduce an image or a video;
a metal plate including a front surface and a rear surface, the front surface of the metal plate disposed on the rear surface of the display panel;
a printed circuit board having a front surface and a rear surface, the front surface of the printed circuit board disposed on the rear surface of the metal plate and the printed circuit board electrically connected to the display panel; and
a chip-on-film having a first end connected to the front surface of the display panel and a second end connected to the rear surface of the printed circuit board, wherein a portion of the chip-on-film is bendable,
wherein the metal plate includes a bending guide formed at a position corresponding to the bendable portion of the chip-on-film and guiding a bent shape of the chip-on-film,
wherein the bending guide includes an elastic deformation reinforcing portion for increasing elastic deformation of the bending guide against external impact by reducing an area of the bending guide in a length direction of the bending guide, and
wherein the chip-on-film is placed on top of a plurality of slit holes formed in the elastic deformation reinforcing portion and extends to the printed circuit board.

2. The display apparatus of claim 1, wherein the chip-on-film is spaced apart from an end of the metal plate and cross the metal plate,
wherein the bending guide protrudes from the end of the metal plate and is formed such that at least a portion of the bending guide is in a bent shape.

3. The display apparatus of claim 1, wherein a plurality of the chip-on-films are disposed, and
wherein a plurality of the bending guides are disposed at an end of the metal plate, wherein the number of bending guides corresponds to the number of chip-on-films.

4. The display apparatus of claim 1, wherein the chip-on-film is disposed such that at least a portion of the chip-on-film is in contact with the bending guide.

5. The display apparatus of claim 1, wherein at least a portion of the chip-on-film maintains a state of being spaced apart from the bending guide.

6. The display apparatus of claim 1, wherein the bending guide has a cross-section of a shape including a curved section.

7. The display apparatus of claim 1, wherein the bending guide has a circular or arc-shaped cross-section.

8. The display apparatus of claim 1, wherein the bending guide has a polygonal cross-section.

9. The display apparatus of claim 1, wherein the bending guide has a cross-section of a shape including a curved section and a straight section.

10. The display apparatus of claim 1, wherein the chip-on-film includes a driving chip for driving the display panel,
    wherein the bending guide includes an avoidance hole defined in a portion of the bending guide corresponding to the driving chip, wherein the avoidance hole is for avoiding contact between the driving chip and the bending guide.

11. The display apparatus of claim 1, wherein the elastic deformation reinforcing portion is formed by defining the plurality of slit holes to be spaced apart from each other in the length direction of the bending guide.

12. The display apparatus of claim 1, further comprising:
    a cover glass disposed at a frontmost portion of the display apparatus;
    an adhesive layer disposed in a rear of the cover glass; and
    a polarizing portion disposed between the adhesive layer and the display panel.

13. The display apparatus of claim 12, further comprising:
    a guide holder disposed between the metal plate and the printed circuit board, wherein the printed circuit board is mounted on one face of the guide holder.

\* \* \* \* \*